(12) United States Patent
Miehl et al.

(10) Patent No.: US 9,930,435 B2
(45) Date of Patent: Mar. 27, 2018

(54) INTERNAL VENT STRUCTURE FOR WATERPROOF MICROPHONE ACOUSTIC CAVITY

(71) Applicant: MOTOROLA SOLUTIONS, INC., Schaumburg, IL (US)

(72) Inventors: Andrew P. Miehl, Boca Raton, FL (US); Deborah A. Gruenhagen, Southwest Ranches, FL (US); Gary A. Lee, Weston, FL (US); David J. Meyer, Fort Lauderdale, FL (US); Karl F. Mueller, Sunrise, FL (US); John Kevin Arledge, Anderson, SC (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 170 days.

(21) Appl. No.: 14/887,647

(22) Filed: Oct. 20, 2015

(65) Prior Publication Data
US 2017/0111721 A1    Apr. 20, 2017

(51) Int. Cl.
*H04R 1/02* (2006.01)
*H04R 1/08* (2006.01)
(Continued)

(52) U.S. Cl.
CPC ............ *H04R 1/086* (2013.01); *H04M 1/035* (2013.01); *H04R 1/04* (2013.01); *H04R 1/083* (2013.01);
(Continued)

(58) Field of Classification Search
CPC .......... H04R 1/023; H04R 1/08; H04R 1/083; H04R 1/086; H04R 1/222; H04R 19/005;
(Continued)

(56) References Cited

U.S. PATENT DOCUMENTS

| 5,365,595 A | 11/1994 | Li |
| 6,188,773 B1 * | 2/2001 | Murata ................. H04R 1/005 128/201.19 |

(Continued)

FOREIGN PATENT DOCUMENTS

JP    2000078676    3/2000

OTHER PUBLICATIONS

PCT/US2016/052527 International Search Report and Written Opinion of the International Searching Authority dated Dec. 12, 2016 (14 pages).

*Primary Examiner* — Huyen D Le
(74) *Attorney, Agent, or Firm* — Michael Best & Friedrich LLP

(57) ABSTRACT

A method and apparatus are described for providing an acoustically-resistive air-permeable venting structure within a sealed microphone acoustic cavity. A microphone is mounted on a printed circuit board and positioned within a housing. A water-resistant membrane seals the microphone from an exterior of the housing, and a active acoustic cavity establishes an acoustical connection between the water-resistant membrane and the microphone. An acoustically-resistive air-permeable venting structure is formed in the body of the printed circuit board and connects to the active acoustic cavity either directly or via a separate vent path. The venting structure provides a viscous dampening effect by venting an active acoustic cavity of the electronic device to the rest of the enclosure sealed by the water-resistant membrane.

18 Claims, 5 Drawing Sheets

(51) Int. Cl.

| | |
|---|---|
| *H05K 1/18* | (2006.01) |
| *H05K 5/02* | (2006.01) |
| *H04R 1/04* | (2006.01) |
| *H04M 1/03* | (2006.01) |
| *H04R 1/28* | (2006.01) |

(52) U.S. Cl.
CPC ............ *H04R 1/2876* (2013.01); *H05K 1/181* (2013.01); *H05K 5/0213* (2013.01); *H04R 2420/07* (2013.01); *H04R 2499/11* (2013.01)

(58) Field of Classification Search
CPC ...... H04R 19/04; H04R 2499/11; H04R 1/04; H04R 1/028; H04R 1/2876; H04R 2420/07; H04M 1/03; H04M 1/035
USPC ....... 381/353, 354, 355, 359, 360, 361, 365, 381/368, 369, 189; 379/420.03, 429, 430, 379/433.03; 455/575.1; 181/149
See application file for complete search history.

(56) References Cited

U.S. PATENT DOCUMENTS

| | | | |
|---|---|---|---|
| 8,150,082 | B2 | 4/2012 | Saito et al. |
| 8,351,634 | B2 | 1/2013 | Khenkin |
| 8,724,841 | B2 * | 5/2014 | Bright .................... H04R 1/086 181/284 |
| 2014/0064542 | A1 | 3/2014 | Bright et al. |
| 2014/0294217 | A1 | 10/2014 | Yamaguchi et al. |

\* cited by examiner

INTERNAL VENT STRUCTURE FOR WATERPROOF MICROPHONE ACOUSTIC CAVITY

BACKGROUND OF THE INVENTION

Water-resistant microphones may be sealed with an air-permeable, water-resistant membrane. However, an air pressure differential across the waterproof barrier can cause swings in the sensitivity of the microphone.

Accordingly, there is a need for microphone device structures that are easy to manufacture and that provide venting for a sealed microphone assembly.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
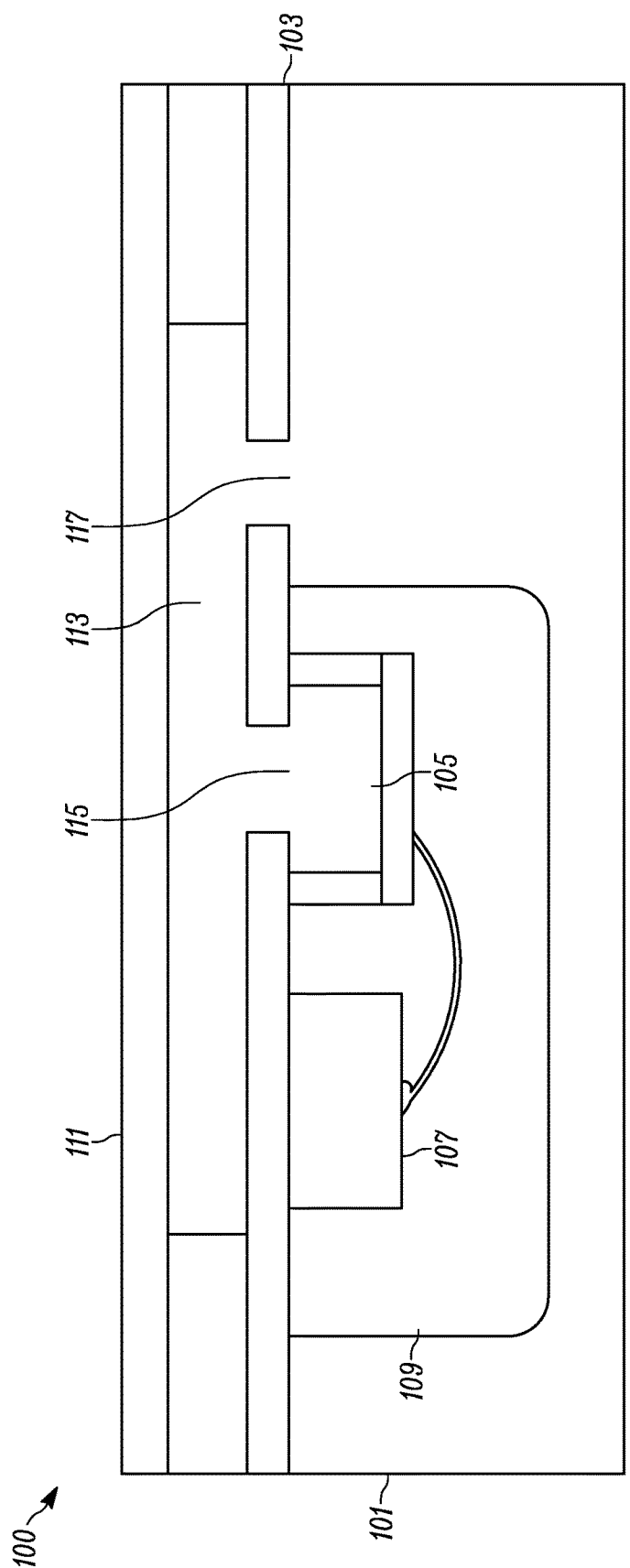
FIG. 1 is a cross-sectional view of an electronic device including a sealed microphone venting structure in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Embodiments described in this disclosure provide, among other things, an electronic device including a housing, a microphone, a water-resistant membrane, and a printed circuit board. The microphone is mounted on the printed circuit board and positioned within the housing. The water-resistant membrane seals the microphone from an exterior of the housing. The printed circuit board is positioned between the microphone and the water-resistant membrane. An acoustically-resistive air-permeable venting structure is formed in the body of the printed circuit board. The venting structure provides a viscous dampening effect by venting an active acoustic cavity of the electronic device to the rest of the enclosure sealed by the water-resistant membrane.

In another embodiment, this disclosure provides a printed circuit board assembly for a sealed electronic device. The printed circuit board assembly includes a microphone mounted on a printed circuit board. A first acoustic input hole is formed through the printed circuit board adjacent to the microphone. An acoustically-resistive air-permeable venting structure is also formed in the printed circuit board to provide restricted venting of an active acoustic chamber of the device to the rest of the enclosure.

FIG. 1 is a cross-sectional view illustrating one example of an internal microphone venting structure for an electronic device 100. An exterior housing 101 is coupled to a printed circuit board 103. A microphone component 105 and an associated application-specific integrated circuit (ASIC) 107 are mounted on the printed circuit board 103. A microphone component housing 109 enclosed the microphone 105 and the application-specific integrated circuit 107 and forms an acoustic cavity for the microphone 105.

Although the example of FIG. 1 illustrates a microphone 105 and an application-specific integrated circuit 107 mounted on the printed circuit board 103 inside the microphone component housing 109, in other implementations, additional or alternative components may be mounted on the printed circuit board. For example, the application-specific integrated circuit 107 illustrated in FIG. 1 might be replaced with a different logic component or, in some implementations, might be positioned at a location outside of the microphone component housing 109.

A water-resistant membrane 111 is coupled to the external housing 101 and forms a venting cavity 113 inside the housing 101. Acoustic vibrations (i.e., sound) transfers across the membrane 111 and reaches the microphone 105 through a primary acoustic input port 115 formed in the printed circuit board 103. A venting structure 117 (or venting port) is also formed in the printed circuit board and allows for venting pressure differentials formed in the venting cavity 113 through the external housing 101. The venting structure 117 provides a viscous dampening effect that beneficially affects the acoustic response of the microphone 105.

Figure 2:
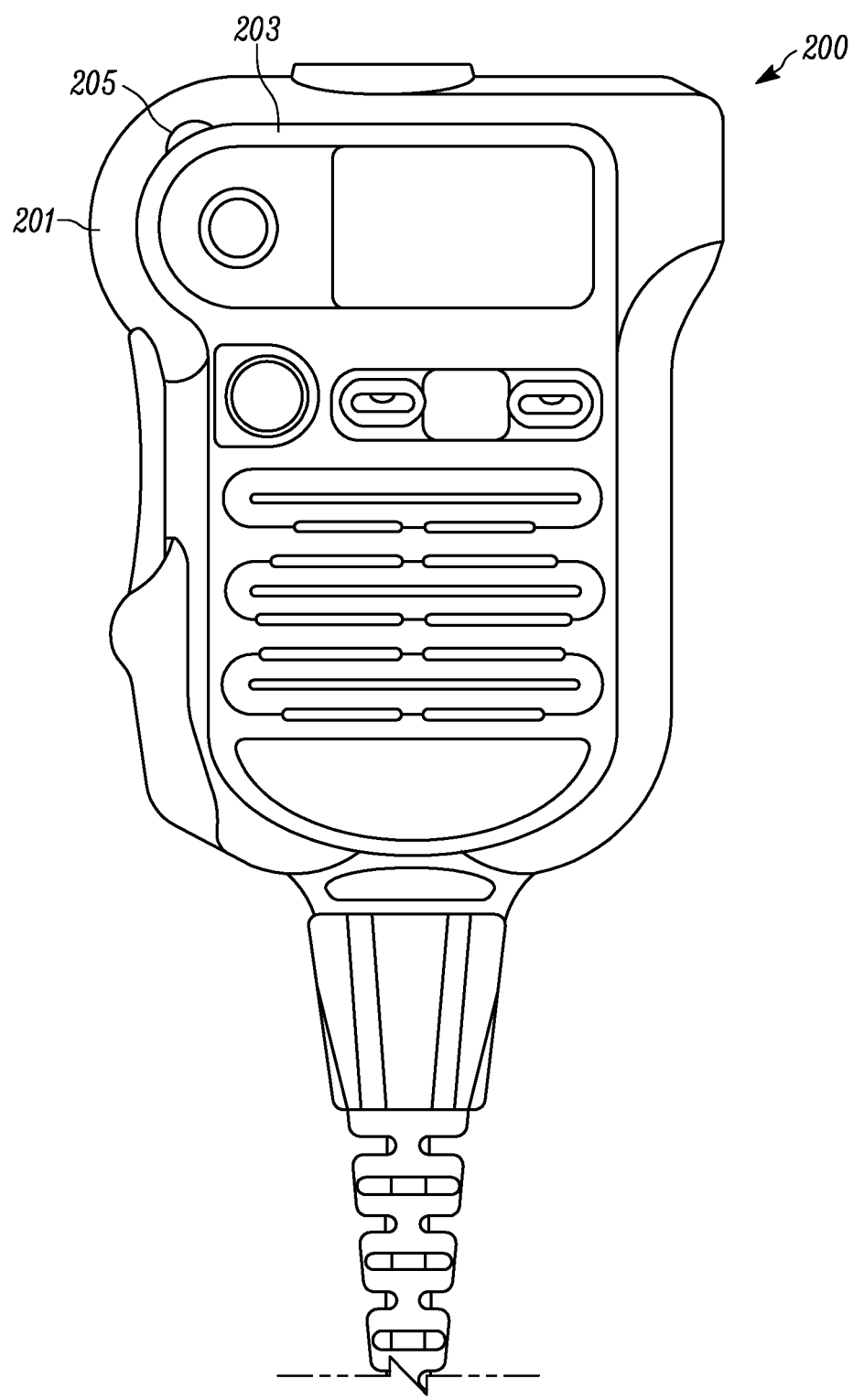
FIG. 2 is an elevation view of another electronic device including a microphone and a sealed venting structure in accordance with some embodiments.

FIG. 2 illustrates another example of an electronic device 200 with an internal venting structure formed in a printed circuit board (PCB) of the electronic device 200. In this example, the electronic device 200 includes a primary housing 201 and a cover insert 203. When the cover insert 203 is coupled to the primary housing 201, a scallop-shaped opening 205 serves as the primary acoustic input for the microphone system. Although the examples described herein illustrate a scallop-shaped opening formed by the coupling of the primary housing 201 and the cover insert 203, in other implementations, the opening 205 may be provided with a different shape or location. For example, in some implementations, an opening might be formed directly in the primary housing 201 or through the cover insert 203.

Figure 3:
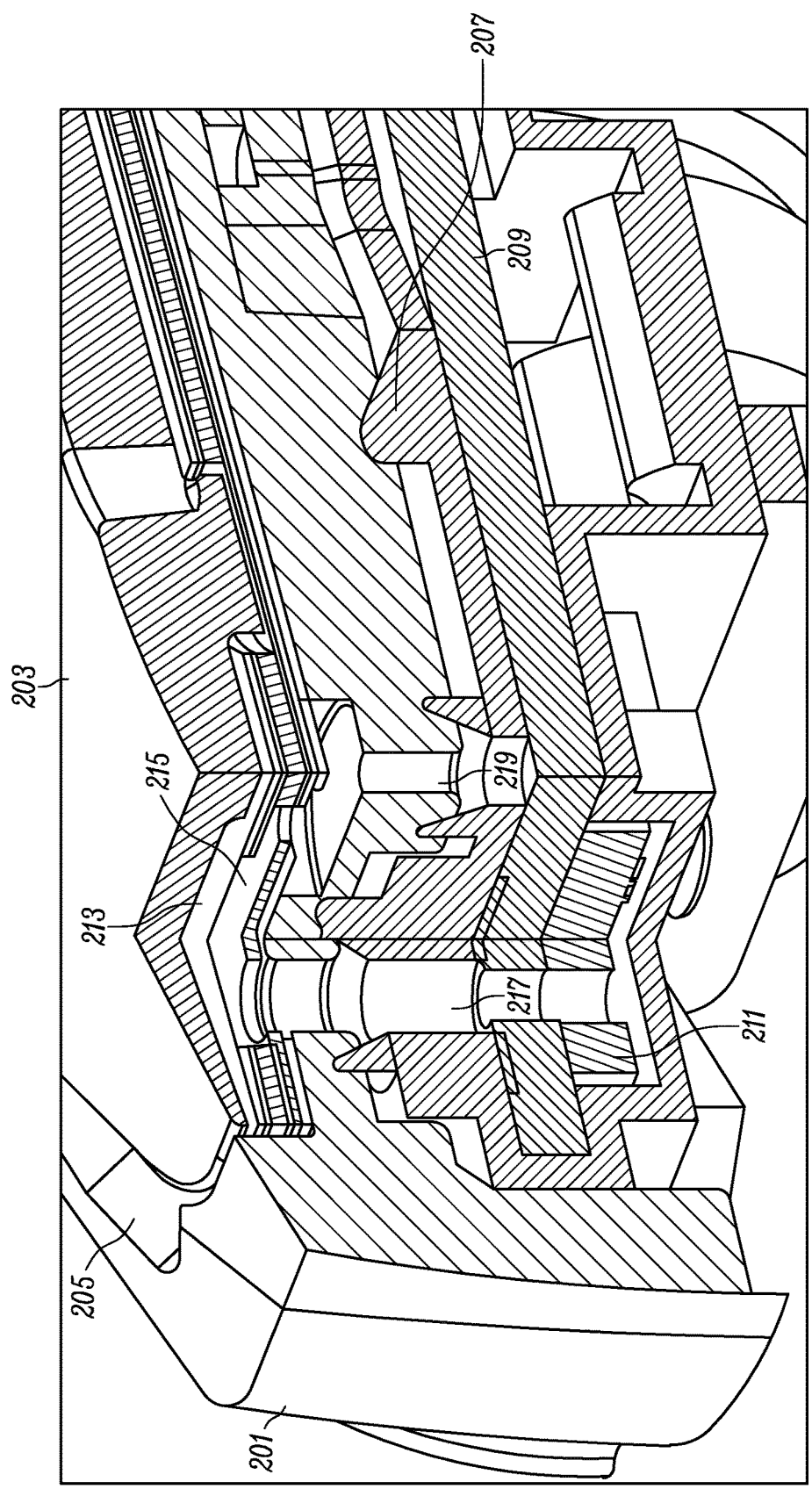
FIG. 3 is cross-sectional view of the electronic device of FIG. 2 in accordance with some embodiments.

FIG. 3 provides a cross-sectional view of the electronic device 200 and further illustrates the internal components of the electronic device 200. As discussed above, the cover insert 203 is coupled to the primary housing 201 to form a scallop-shaped opening 205. The electronic device 200 also includes a second housing component 207 that encloses a printed circuit board 209 and a microphone assembly 211 mounted on the printed circuit board 209. Acoustic vibrations (i.e., sounds) enter through the scallop-shaped opening 205, transfer across a water resistant membrane 213, and pass through a primary acoustic input channel 217 to reach the microphone assembly 211.

As used herein, the term "water resistant" means the ability to resist the penetration of water to some degree. The term "water proof" means that the component or device is impervious to water. As such, as used in this disclosure, the water resistant membrane 213 is a water proof membrane in some implementations where the membrane is impervious to water. In some other implementations, the water resistant membrane 213 resists the penetration of water, but is not entirely impervious.

A water resistant membrane 213 is positioned between the cover insert 203 and the primary housing 201 to prevent water from entering the acoustic input channel 217. The positioning of the membrane 213 forms a venting cavity 215. A venting channel 219 is formed through the primary housing 201 and the second housing component 207 to couple the venting cavity 215 to a resistive venting structure formed in the printed circuit board 209.

Figure 4:
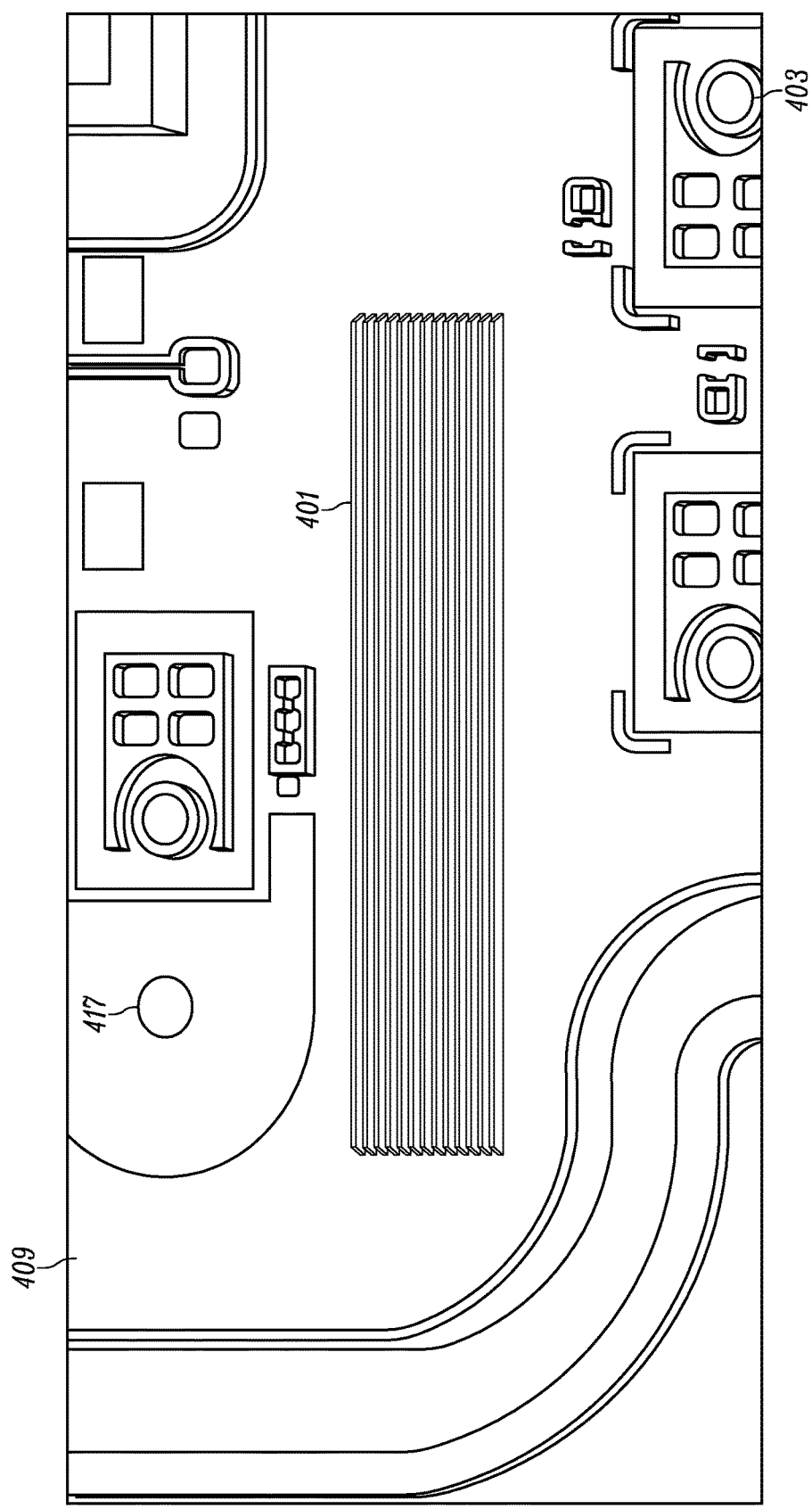
FIG. 4 is an overhead view of the printed circuit board of the electronic device of FIG. 2 in accordance with some embodiments.

FIG. 4 illustrates one example of such a resistive venting structure 401 formed in a printed circuit board 409 for use in an electronic device such as the one illustrated in FIGS. 2 and 3 hereinbefore. The resistive venting structure 401 is etched into the surface of the printed circuit board 409. The resistive venting structure 401 includes a series of narrow (i.e. ⅒ mm) parallel lines or channels that are finely pitched (i.e., ⅒ mm distance between) through the printed circuit board 409. The size and pitch of the channels forming the resistive venting structure 401 allow commutation of air to vent through the printed circuit board 409 (for air pressure relief), but provide resistance to oscillatory air movement (i.e., sounds) so that the sensitivity of the microphone is improved. In the example of FIG. 4, three walls of the channel are etched into the surface of the printed circuit board 409 while the fourth wall of the channel is established by a seal that covers the channels in this region (item 207 from FIG. 3). However, other implementations may utilize other quantities, positions, layouts, or etching techniques to form the resistive venting structure.

The resistive venting structure 401 can be formed using photo-etching or other printed circuit board manufacturing processes. For example, the resistive venting structure 401 of FIG. 4 is formed by selectively removing copper and solder resist using printed circuit board manufacturing materials and processes. By forming the resistive venting structure 401 in the printed circuit board 409, the manufacturing process can be finely tuned to provide fine details including very precise depths and shapes. Furthermore, by providing a resistive venting structure 401 with multiple "passages" through the printed circuit board 409, the dampening effect provided by the venting continues even if one of the "passages" in the printed circuit board becomes blocked or obstructed.

Although the example of FIG. 4 illustrates the resistive venting structure 401 formed by a series of parallel lines etched into the printed circuit board 409, other layouts and configurations are possible. For example, in the implementation illustrated in FIG. 4, the parallel channels are ⅒ mm wide with a distance of ⅒ mm between channels. However, in other implementations, the pitch and the width of the channels are not necessarily the same. Furthermore, in still other implementations, the width of each parallel channel is not necessarily the same—some channels may be wider or more widely spaced than others.

Figure 5:
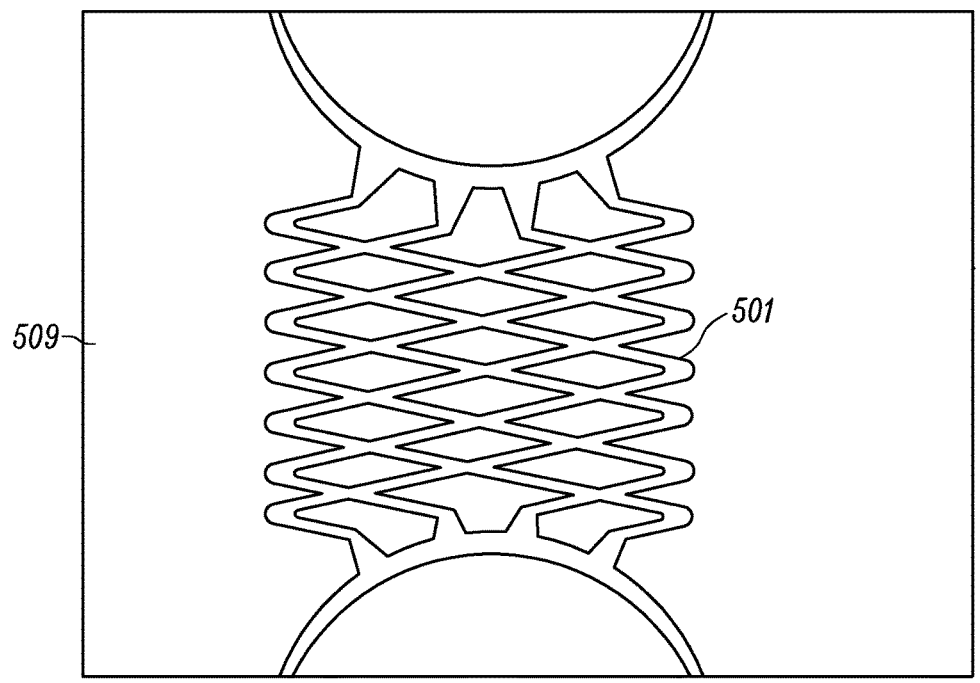
FIG. 5 is an overhead view of a printed circuit board with another etched venting pattern in accordance with some embodiments.
Figure 6:
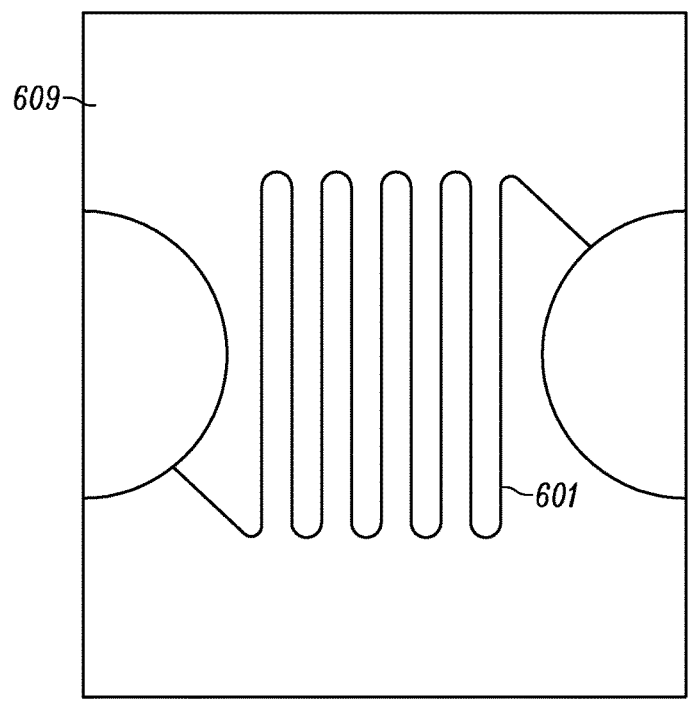
FIG. 6 is an overhead view of a printed circuit board with yet another etched venting pattern in accordance with some embodiments.

Patterns other than parallel lines can also be used for the resistive venting structure 401. For example, FIG. 5 illustrates an example of a resistive venting structure 501 formed by etching a "cross-hatched" pattern of angled crossing lines in a printed circuit board 509. FIG. 6 illustrates yet another example of a resistive venting structure 601 formed by etching a single line in an alternating switchback pattern in a printed circuit board 609. In still other examples, the etched pattern forming the resistive venting structure could take other further forms, shapes, and patterns including, for example, "squiggly" lines or cross-hatching at other angles (e.g., lines at 45 degrees that intersect each other at 90 degree angles). The venting structure itself may be formed in the copper, solder-mask, or dielectric layers of the PCB, or any combination thereof.

Returning now to the example of FIG. 4, a hole 417 is formed in the printed circuit board 409 for the acoustic input channel (i.e., where sound passes through to the microphone). Some electronic devices include multiple microphones and, as such, the printed circuit board 409 may be etched to include multiple holes such as, for example, microphone hole 403. Depending on the structure of the housing and the layout of the microphone components, these additional microphones may include an acoustic input channel that is coupled to the same resistive venting structure 401, coupled to an additional resistive venting structure (that may be specifically tuned to the requirements of the additional microphone), or coupled to no resistive venting structure. In other implementations, the separate venting channel 219 may be omitted and the resistive venting structure may instead tap into to the acoustic input channel 217 (FIG. 3).

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An electronic device comprising:
   a housing;
   a microphone mounted on a printed circuit board within the housing;
   a water-resistant membrane sealing the microphone from an exterior of the housing; and
   the printed circuit board including an acoustically-resistive air-permeable venting structure formed in a body of the printed circuit board.

2. The electronic device of claim 1, wherein the water-resistant membrane is positioned to form a venting cavity on an interior side of the water-resistant membrane,
   the electronic device further comprising a primary acoustic input channel coupling the venting cavity to the microphone.

3. The electronic device of claim 2, wherein the printed circuit board is positioned between the microphone and the water-resistant membrane, and
   wherein the printed circuit board includes an acoustic input hole through the body of the printed circuit board coupling the primary acoustic input channel to the microphone.

4. The electronic device of claim 2, further comprising a venting channel coupling the venting cavity to the acoustically-resistive air-permeable venting structure formed in the body of the printed circuit board.

5. The electronic device of claim 4, wherein the acoustically-resistive air-permeable venting structure formed in the body of the printed circuit board provides for restricted air flow between the venting cavity and another portion of the electronic device sealed from the exterior of the housing by the water-resistant membrane.

6. The electronic device of claim 1, wherein the acoustically-resistive air-permeable venting structure includes a plurality of pitched channels formed in the printed circuit board.

7. The electronic device of claim 6, wherein the plurality of pitched channels are linearly parallel across a surface of the printed circuit board.

8. The electronic device of claim 6, wherein the plurality of pitched channels are formed by selectively removing a copper and solder resist using an etching process.

9. The electronic device of claim 1, wherein the acoustically-resistive air-permeable venting structure includes a plurality of cross-hatched lines etched into a surface of the printed circuit board.

10. The electronic device of claim 1, wherein the acoustically-resistive air-permeable venting structure includes a channel formed by an etched alternating switchback pattern on a surface of the printed circuit board.

11. The electronic device of claim 1, further comprising an active acoustic cavity sealed from the exterior of the housing by the water-resistant membrane, and wherein the acoustically-resistive air-permeable venting structure is configured to vent the sealed active acoustic cavity to provide a viscous dampening effect that affects the acoustic response of the microphone.

12. A printed circuit board assembly for a sealed electronic device comprising:
    a microphone mounted on a printed circuit board;
    a first acoustic input hole formed through the printed circuit board adjacent to the microphone; and
    an acoustically-resistive air-permeable venting structure formed in the printed circuit board.

13. The printed circuit board assembly of claim 12, wherein the printed circuit board assembly is configured to be enclosed in the sealed electronic device such that acoustic vibrations pass through a water-resistant membrane of the sealed electronic device and through the first acoustic input hole to reach the microphone, and wherein the acoustically-resistive air-permeable venting structure is configured to vent an active acoustic cavity of the sealed electronic device to provide viscous acoustic dampening.

14. The printed circuit board assembly of claim 13, wherein the acoustically-resistive air-permeable venting structure formed in a body of the printed circuit board provides for restricted air flow between a venting cavity and another portion of the electronic device sealed from an exterior of a housing of the electronic device by the water-resistant membrane.

15. The printed circuit board assembly of claim 12, wherein the acoustically-resistive air-permeable venting structure includes a plurality of pitched channels formed in the printed circuit board.

16. The printed circuit board of claim 15, wherein the plurality of pitched channels are linearly parallel across a surface of the printed circuit board.

17. The printed circuit board of claim 12, wherein the acoustically-resistive air-permeable venting structure includes a plurality of cross-hatched lines etched into a surface of the printed circuit board.

18. The printed circuit board of claim 12, wherein the acoustically-resistive air-permeable venting structure includes a channel formed by an etched alternating switch-back pattern on a surface of the printed circuit board.

\* \* \* \* \*